US009583156B2

(12) United States Patent
Luo et al.

(10) Patent No.: US 9,583,156 B2
(45) Date of Patent: Feb. 28, 2017

(54) SELECTED GATE DRIVER CIRCUIT IN MEMORY CIRCUITS, AND CONTROL DEVICE AND CONTROL METHOD THEREOF

(71) Applicant: Semiconductor Manufacturing International (Shanghai) Corporation, Shanghai (CN)

(72) Inventors: Guangyan Luo, Shanghai (CN); Hao Ni, Shanghai (CN); Changwei Yin, Shanghai (CN); Xiao Zheng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/200,252

(22) Filed: Jul. 1, 2016

(65) Prior Publication Data

US 2017/0004864 A1 Jan. 5, 2017

(30) Foreign Application Priority Data

Jul. 1, 2015 (CN) .......................... 2015 1 0377793

(51) Int. Cl.

| | |
|---|---|
| ***G11C 5/06*** | (2006.01) |
| ***G11C 7/00*** | (2006.01) |
| ***G11C 5/02*** | (2006.01) |
| ***G11C 11/412*** | (2006.01) |
| *G11C 11/4097* | (2006.01) |

(52) U.S. Cl.

CPC ................ *G11C 7/00* (2013.01); *G11C 5/025* (2013.01); *G11C 5/063* (2013.01); *G11C 11/412* (2013.01); *G11C 11/4097* (2013.01)

(58) Field of Classification Search

CPC ........... G11C 7/00; G11C 5/063; G11C 5/025; G11C 11/412; G11C 11/4097

USPC .......................................................... 365/72

See application file for complete search history.

(56) References Cited

U.S. PATENT DOCUMENTS 6,859,402 B2 * 2/2005 Campbell ............ G11C 7/1006 326/86
7,075,852 B2 * 7/2006 Dono ....................... G11C 8/14 365/230.06
7,288,406 B2 * 10/2007 Bogin .................... C07K 14/50 435/320.1

(Continued)

*Primary Examiner* — Pho M Luu
(74) *Attorney, Agent, or Firm* — Anova Law Group, PLLC

(57) ABSTRACT

A selected gate (SG) driver circuit, including a first NMOS transistor, a second NMOS transistor, a third NMOS transistor, a first PMOS transistor, and a second PMOS transistor. A gate electrode of the first NMOS transistor is connected to a gate electrode of the first PMOS transistor, a source electrode of the first NMOS transistor being connected to a drain electrode of the third NMOS transistor, and a drain electrode of the first NMOS transistor being connected to a drain electrode of the first PMOS transistor and a gate electrode of the second NMOS transistor. A source electrode of the second NMOS transistor is connected to a source electrode of the third NMOS transistor, and a drain electrode of the second NMOS transistor being connected to a drain electrode of the second PMOS transistor and a gate electrode of the third NMOS transistor.

14 Claims, 9 Drawing Sheets

(56) References Cited

U.S. PATENT DOCUMENTS 7,633,830 B2 * 12/2009 Evans .................... G11C 8/08 365/230.06
7,649,800 B2 * 1/2010 Takahashi ............... G11C 8/08 365/185.23

* cited by examiner

SELECTED GATE DRIVER CIRCUIT IN MEMORY CIRCUITS, AND CONTROL DEVICE AND CONTROL METHOD THEREOF

CROSS-REFERENCES TO RELATED APPLICATIONS

This application claims the priority of Chinese Patent Application No. 201510377793.3, filed on Jul. 1, 2015, the entire content of which is incorporated herein by reference.

FIELD OF THE DISCLOSURE

The present disclosure relates to the field of semiconductor technology, more particularly, relates to a selected gate driver circuit used in memory circuits, a related control device and a related control method.

BACKGROUND

Non-volatile memories (NVRAMs) are common semiconductor devices. NVRAMs have many types based on the different materials and structures.

Recently, as portable electronic devices such as mobile phones and computers are widely used, NVRAMs have been widely developed. Almost all NVRAMs include selected gate (SG) driver circuits.

However, when using existing SG driver circuits to drive NVRAMs operated in high speed, the NVRAMs need to hop from idle phase to read operation phase if a read operation needs to be executed. The word line preparation phase of the read operation may be too short to result in competition between MOS transistors in the SG driver circuit. The read operation may not be executed accurately.

The disclosed SG driver circuit, related control device and control method are directed to solve one or more problems set forth above and other problems.

BRIEF SUMMARY OF THE DISCLOSURE

Embodiments of the present disclosure provide a SG driver circuit, a related control device, and a related control method. By using the disclosed SG driver circuit, the control device, and the control method, read operations may be executed more accurately in an NVRAM when operated in high speed.

One aspect of the present disclosure provides a selected gate (SG) driver circuit used in a memory circuit, including a first NMOS transistor, a second NMOS transistor, a third NMOS transistor, a first PMOS transistor, and a second PMOS transistor. A gate electrode of the first NMOS transistor is connected to a gate electrode of the first PMOS transistor, a source electrode of the first NMOS transistor being connected to a drain electrode of the third NMOS transistor, and a drain electrode of the first NMOS transistor being connected to a drain electrode of the first PMOS transistor and a gate electrode of the second NMOS transistor. A source electrode of the second NMOS transistor is connected to a source electrode of the third NMOS transistor, and a drain electrode of the second NMOS transistor being connected to a drain electrode of the second PMOS transistor and a gate electrode of the third NMOS transistor. A source electrode of the first PMOS transistor is connected to a gate electrode of the second PMOS transistor. A logic high voltage level is connected to a source electrode of the second PMOS transistor.

Another aspect of the present disclosure provides a control device for controlling the SG driver circuit. The control device includes a first control unit, a second control unit, a third control unit, and a fourth control unit. The first control unit is configured to apply the logic high voltage level on the source electrode of the second PMOS transistor. The second control unit is configured to apply a seventh control signal on the source electrode of the second NMOS transistor, the seventh control signal providing a logic high voltage level when the memory circuit is at idle phase and at word line preparation phase of a read operation, and the seventh control signal providing a logic low voltage level when the memory circuit is at execution phase of a read operation, wherein a read operation phase includes the word line preparation phase of the read operation and the execution phase of the read operation. The third control unit is configured to apply a logic low voltage level on the gate electrode of the first PMOS transistor. The fourth control unit is configured to apply a second control signal on the gate electrode of the second PMOS transistor, the second control signal providing a logic low voltage level when the memory circuit is at idle phase, and providing a logic high voltage level when the memory circuit is at read operation phase.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

An aspect of the present disclosure provides a SG driver circuit used in NVRAMs.

Figure 1:
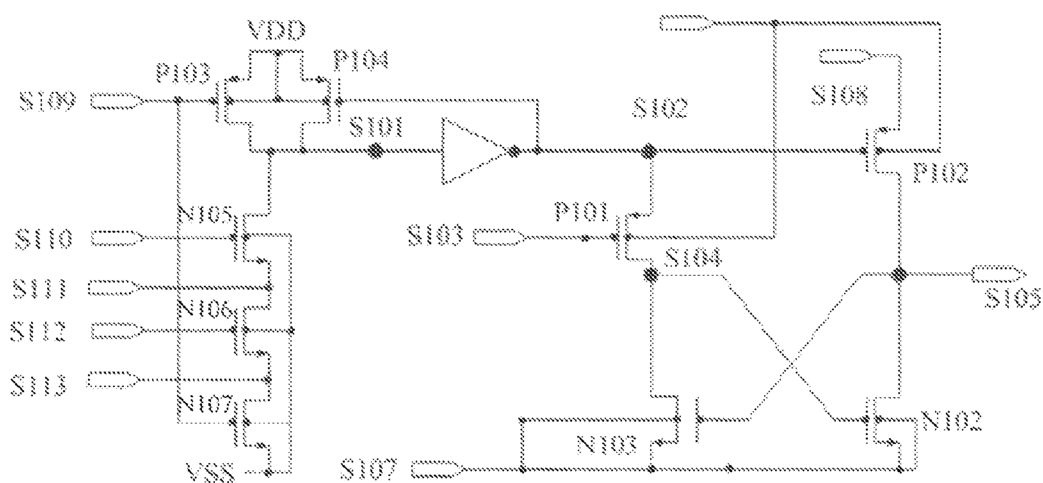
FIG. 1 illustrates a structure of an existing SG driver circuit incorporated in an existing NVRAM.
Figure 2:
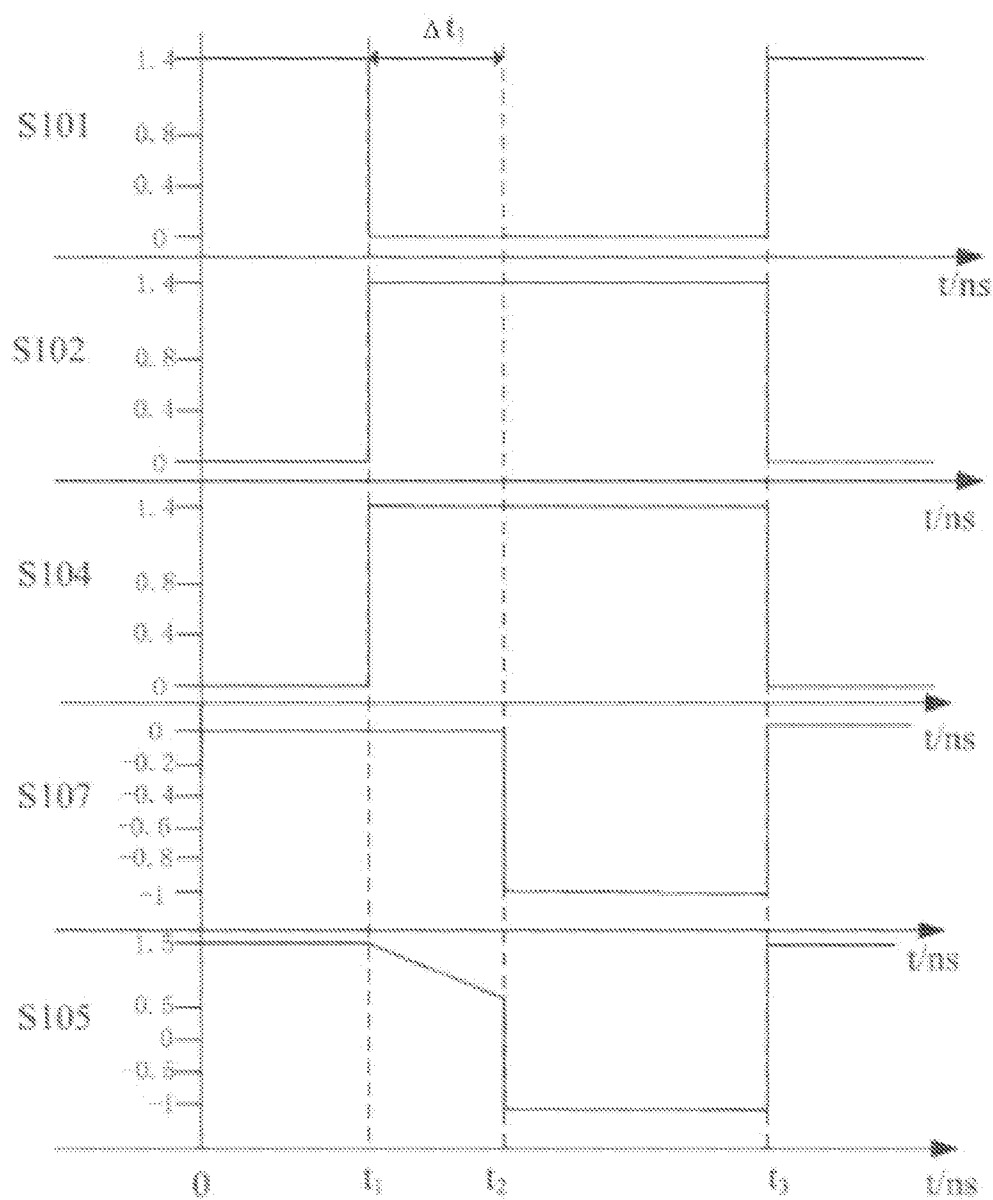
FIG. 2 illustrates a wave-function diagram of certain signals of the NVRAM in FIG. 1 when the NVRAM is operated in low speed.

FIG. 1 illustrates the structure of an existing SG driver circuit used in NVRAMs. FIG. 2 illustrates certain signals of an existing NVRAM, shown in FIG. 1, switching or hopping from idle phase/mode to read operation phase and from read operation phase back to idle phase, when the NVRAM is operated in low speed. FIG. 2 illustrates certain signals of an existing NVRAM, shown in FIG. 1, switching from idle phase to read operation phase, when the NVRAM is operated in high speed.

As shown in FIGS. 1 and 2, when an existing NVRAM is operated in low speed and a read operation is to be executed, the NVRAM may switch from idle phase to read operation phase. The NVRAM stays in idle phase from 0 s to $t_1$. The NVRAM stays in a first word line preparation phase of the read operation from $t_1$ to $t_2$, i.e., in duration $\Delta t_1$. The NVRAM stays in execution phase of the read operation from $t_2$ to $t_3$. The NVRAM stays in idle phase after $t_3$ until switching to next read operation. The ninth control signal S109, the tenth control signal S110, the eleventh control signal S111, the twelfth control signal S112, and the thirteenth control signal S113 provide logic high voltage levels. Thus, the third PMOS transistor P103 is turned off. The fifth NMOS transistor, the sixth NMOS transistor N106, and the seventh NMOS transistor N107 are turned on. The voltage of the first control signal S101 is pulled down to a logic low voltage level. The logic low voltage level is inverted by an inverter and outputted by the inverter as the second control signal S102.

Because the eighth control signal S108 provides a logic high voltage level, the second PMOS transistor P102 is turned off. Because the third control signal S103 provides a logic low voltage level, the first PMOS transistor P101 is turned on. The second control signal S102 thus pulls up the voltage of the fourth control signal S104 to a logic high voltage level.

At this time, the seventh control signal S107 provides a logic high voltage level. However, the logic high voltage level provided by the seventh control signal S107 is still lower than the output voltage of the fifth output signal S105, so the second NMOS transistor N102 is turned on. The seventh control signal S107 thus pulls down the output voltage of the fifth output signal S105 through the second NMOS transistor N102.

As shown in FIGS. 1 and 2, when an existing NVRAM is operated in low speed, after the first word line preparation phase of the read operation, i.e., $\Delta$t1, the voltage provided by the seventh control signal S107 drops from 0 V to −1 V. Because the output voltage of the fifth output signal S105 is already pulled down from 1.5 V to about 0.6 V during the first word line preparation phase of the read operation $\Delta$t1, the output voltage of the fifth output signal S105 is not sufficient to turn on the third NMOS transistor N103. Thus, the output voltage of the fifth output signal S105 can further be pulled down by the seventh control signal S107 through the second NMOS transistor N102, until the output voltage of the fifth output signal S105 reaches a target voltage. The switch from the idle phase to the read operation phase can be accurately executed.

Figure 3:
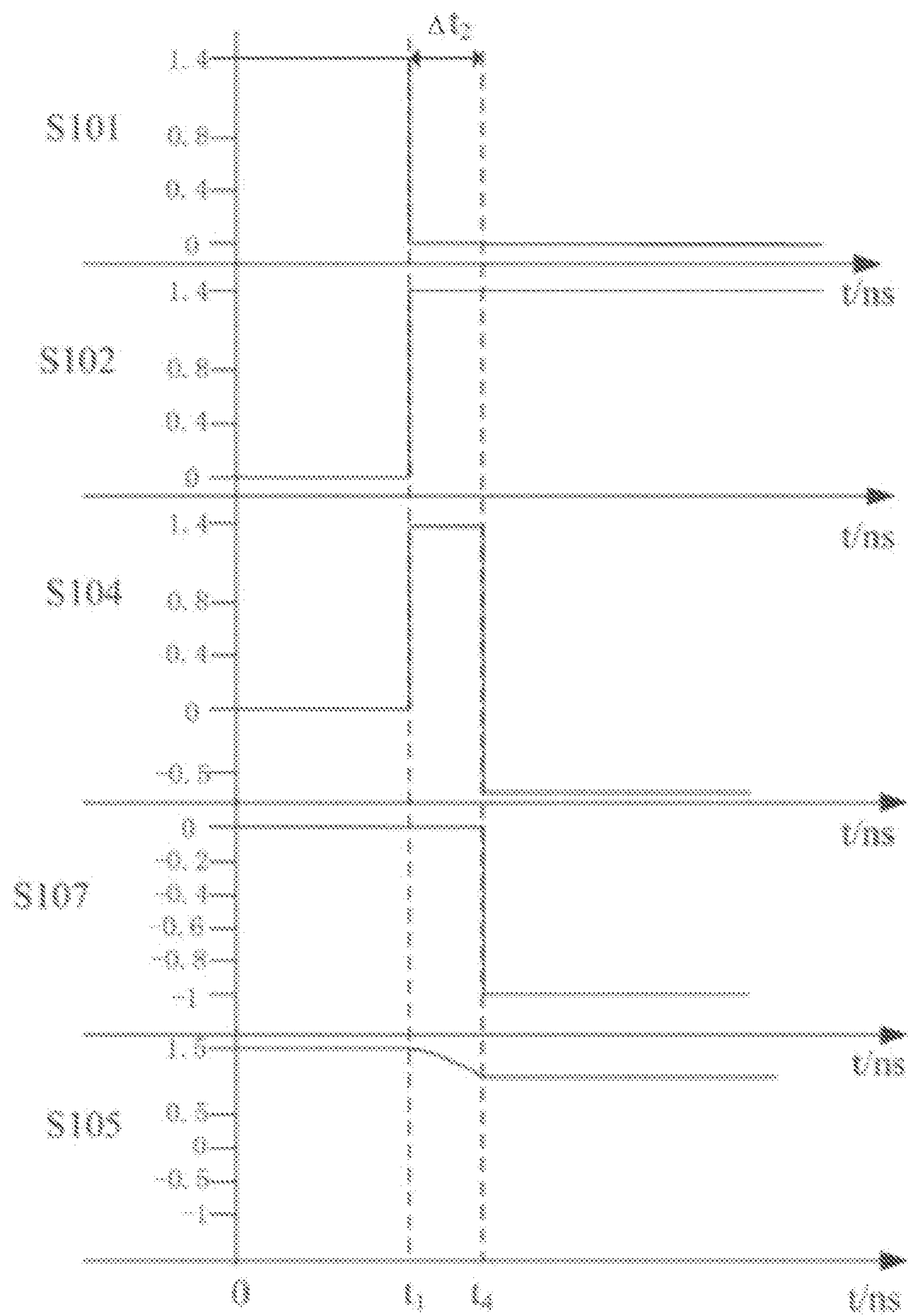
FIG. 3 illustrates an exemplary wave-functions of certain signals of the NVRAM in FIG. 1 when the NVRAM is operated in high speed.

As shown in FIGS. 1 and 3, when an existing NVRAM is operated in high speed and is switching from idle phase to read operation phase, the NVRAM stays in idle phase from 0 s to $t_1$. The NVRAM stays in a second word line preparation phase of the read operation from $t_1$ to $t_4$, i.e., in duration $\Delta t_2$. The NVRAM stays in execution phase of the read operation after $t_4$ until switching to next idle phase. After the second word line preparation phase of the read operation, i.e., $\Delta t_2$, the seventh control signal S107 drops from 0 V to −1 V. Because the second word line preparation phase of the read operation $\Delta t_2$ is shorter than the first word line preparation phase of the read operation $\Delta t_1$, and the load connected to or driven by the fifth output signal S105 is sufficiently large, the change of the output voltage of the fifth output signal S105 is slower than other signals.

Thus, after the second word line preparation phase of the read operation $\Delta t_2$, the output voltage of the fifth output signal S105 may be pulled down from 1.5 V to about 1.1 V, still sufficiently high to turn on the third NMOS transistor N103. At this time, the seventh control signal S107 may pull down the fourth control signal S104 through the third NMOS transistor N103.

Because the second control signal S102 constantly pulls up the voltage of the fourth control signal S104 through the first PMOS transistor P101, a competition occurs between the first PMOS transistor P101 and the third NMOS transistor N103. Also, the voltage of the fourth control signal S104 decreases faster than the output voltage of the fifth output signal S105. That is, although the fourth control signal S104 has decreased to a voltage value to turn off the second NMOS transistor N102, the output voltage of the fifth output signal S105 still has not been pulled down to the target voltage. At this time, because the second NMOS transistor N102 is turned off, the output voltage of the fifth output signal S105 would not be further pulled down.

When the NVRAM is operated in high speed and a read operation is to be executed, the NVRAM needs to switch from idle phase to read operation phase. Because the word line preparation phase of the read operation $\Delta t_2$ is short, the output voltage of the fifth output signal S105 would not be pulled down to a voltage that is sufficiently low to turn off the third NMOS transistor N103 in the word line preparation phase of the read operation $\Delta t_2$. As a result, a competition occurs between the first PMOS transistor P101 and the third NMOS transistor N103, and the output voltage of the fifth output signal S105 would not be pulled down to the target voltage. The read operation may not be operated accurately.

To solve the issues described above, embodiments of the present disclosure provide a SG driver circuit capable of avoiding competitions between MOS transistors. It should be noted that, in the present disclosure, the term "voltage of a certain signal" and "output voltage of a certain signal" may represent the voltage provided by the certain signal. The term "voltage of a certain signal" may be interchangeable with the term "voltage provided by a certain signal", "output voltage of a certain signal", or the alike.

Figure 4:
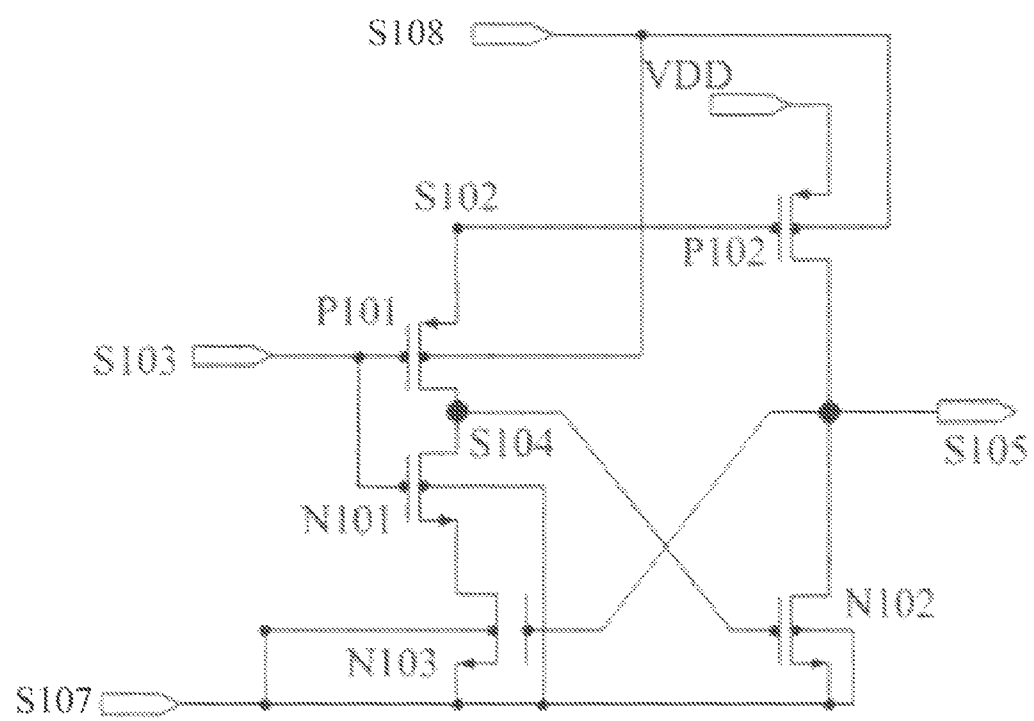
FIG. 4 illustrates a structure of an exemplary SG driver circuit incorporated in an NVRAM consistent with various embodiments of the present disclosure.

As shown in FIG. 4, the SG driver circuit provided by the embodiments of the present disclosure may include a first NMOS transistor N101, a second NMOS transistor N102, a third NMOS transistor N103, a first PMOS transistor P101, and a second PMOS transistor P102.

The gate electrode of the first NMOS transistor N101 may be connected to the gate electrode of the first PMOS transistor P101. The source electrode of the first NMOS transistor N101 may be connected to the drain electrode of the third NMOS transistor N103. The drain electrode of the first NMOS transistor N101 may be connected to the drain electrode of the first PMOS transistor P101 and the gate electrode of the second NMOS transistor N102. The source electrode of the second NMOS transistor N102 may be connected to the source electrode of the third NMOS transistor N103. The drain electrode of the second NMOS transistor N102 may be connected to the drain electrode of the second PMOS transistor P102 and the gate electrode of the third NMOS transistor N103. The source electrode of the first PMOS transistor P101 may be connected to the gate electrode of the second PMOS transistor P102. The source electrode of the second PMOS transistor may be connected to a logic high voltage level VDD.

Figure 7:
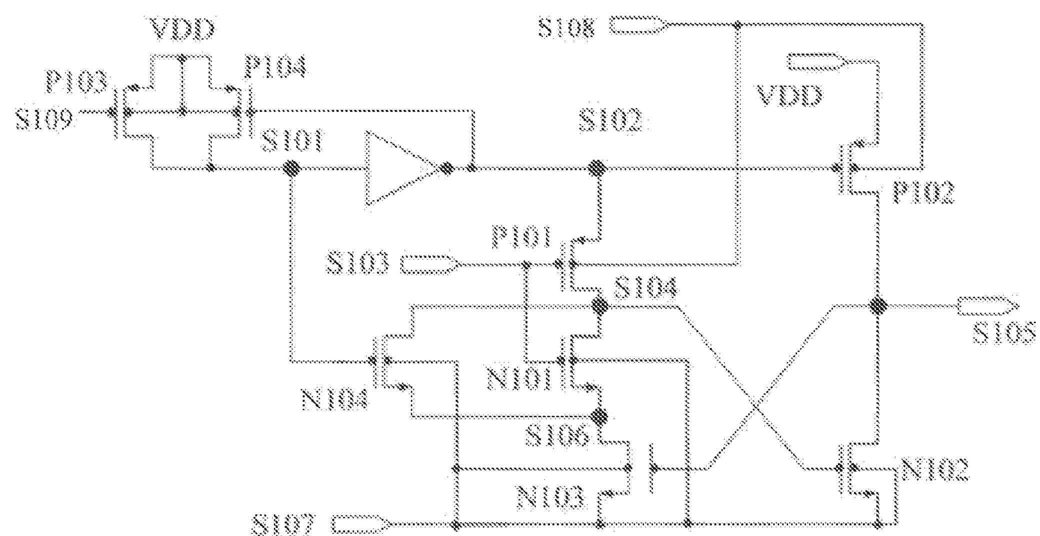
FIG. 7 illustrates a structure of another exemplary SG driver circuit incorporated in an NVRAM consistent with various embodiments of the present disclosure.
Figure 8:
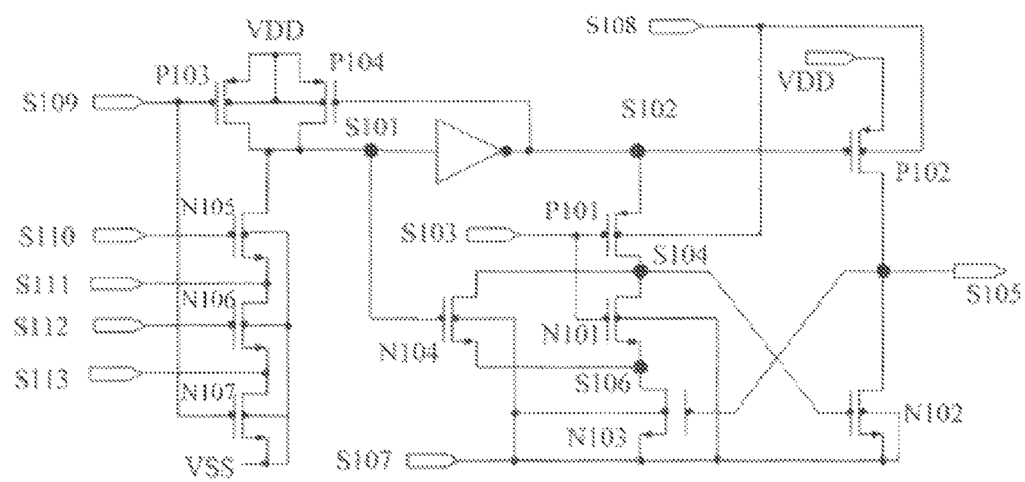
FIG. 8 illustrates a structure of another exemplary SG driver circuit incorporated in an NVRAM consistent with various embodiments of the present disclosure.
Figure 9:
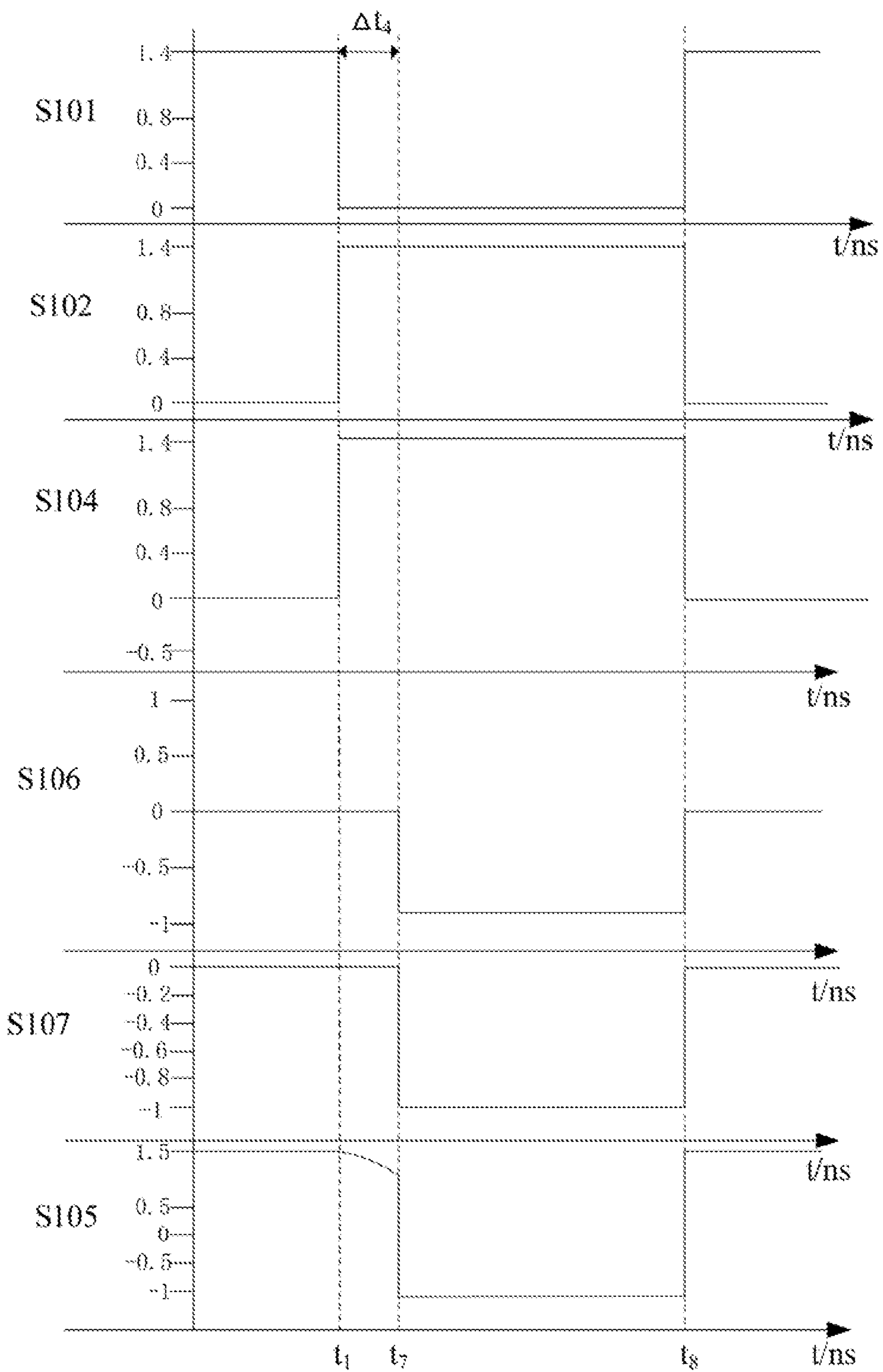
FIG. 9 illustrates another exemplary wave-function diagram of certain signals of an NVRAM when the NVRAM is operated in high speed.

Embodiments are now illustrated in detail in FIGS. 4-10. FIG. 9 illustrates an exemplary control method for controlling the SG driver circuit used in an NVRAM, as shown in FIG. 4.

According to the control method, a logic high voltage level VDD may be applied on the source electrode of the second PMOS transistor. A seventh control signal S107 may be applied on the source electrode of the second NMOS transistor N102 and the source electrode of the third NMOS transistor N103. The seventh control signal S107 may provide a logic high voltage level at idle phase and a logic low voltage level at execution phase of the read operation. A third control signal S103 may be applied on the gate electrode of the first PMOS transistor P101 and the gate electrode of the first NMOS transistor N101. The third control signal S103 may provide a logic low voltage level. A fourth control signal S104 may be applied on the drain electrode of the first PMOS transistor P101, the drain electrode of the first NMOS transistor N101, and the gate electrode of the second NMOS transistor N102. The fourth control signal S104 may provide a logic low voltage level at idle phase and may provide a logic high voltage level at execution phase of the read operation.

The fifth output signal S105, outputted by the drain electrode of the second NMOS transistor N102, the drain electrode of the second PMOS transistor P102, and the gate electrode of the third NMOS transistor N103, may provide a logic high voltage level at idle phase and may provide a logic low voltage level at execution phase of the read operation. The second control signal S102 may be applied on the source electrode of the first PMOS transistor and the gate electrode of the second PMOS transistor P102. The second control signal S102 may provide a logic low voltage level at idle phase and may provide a logic high voltage level at execution phase of the read operation.

The working principles of the disclosed SG driver circuit are now described in FIGS. 4-9.

When the NVRAM is operated in high speed and switching from idle phase to execution phase of the read operation, as shown in FIG. 9, the NVRAM may be in idle phase from 0 s to $t_1$, in word line preparation phase of the read operation from $t_1$ to $t_7$, in execution phase of the read operation from $t_7$ to $t_8$, i.e., duration $\Delta t_4$, and in idle phase after $t_8$ until switching to next read operation phase. Because the second control signal S102 provides a logic high voltage level, the source electrode of the second PMOS transistor P102 may provide a logic high voltage level, and the second PMOS transistor P102 may be turned off. The third control signal may provide a logic low voltage level, so that the first PMOS transistor P101 may be turned on, and the first NMOS transistor N101 may be turned off. The second control signal S102 may pull up the voltage of the fourth control signal S104 to a logic high voltage level.

After the voltage of the fourth control signal S104 becomes a logic high voltage level, because the voltage of the seventh control signal S107 is 0 V, the second NMOS transistor N102 may be turned on. The seventh control signal S107 may pull down the output voltage of the fifth output signal S105 through the second NMOS transistor N102.

After the fourth word line preparation phase of the read operation $\Delta t_4$, the voltage provided by the seventh control signal S107 may drop from 0 V to −1 V. Although the fourth word line preparation phase of the read operation $\Delta t_4$ is not longer than the first word line preparation phase of the read operation $\Delta t_1$, the load connected to the fifth output signal S105 may still be sufficiently large that the voltage change on the fifth output signal S105 is slower than the voltage changes on the fourth control signal S104. After the word line preparation phase of the read operation $\Delta t_4$, the output voltage of the fifth output signal S105 may be pulled down from 1.5 V to about 1.1 V, which is sufficiently high to turn on the third NMOS transistor N103.

Because the third control signal S103 provides a logic low voltage level, the first NMOS transistor N101 may be turned off. At this time, even if the third NMOS transistor N103 is turned on, the seventh control signal S107 would not be able to pull down the voltage of the fourth control signal S104 through the third NMOS transistor N103. The second control signal S102 may constantly pull up the voltage of the fourth control signal S104 through the first PMOS transistor P101. That is, the fourth control signal S104 may constantly keep a high voltage so that the second NMOS transistor N102 may be kept on. The seventh control signal S107 may constantly pull down the voltage of the fifth output signal S105 through the second NMOS transistor N102 until the output voltage of the fifth output signal S105 decreases to the target voltage for a read operation to be accurately executed.

Another aspect of the present disclosure provides a control device for controlling the disclosed SG driver circuit.

Figure 10:
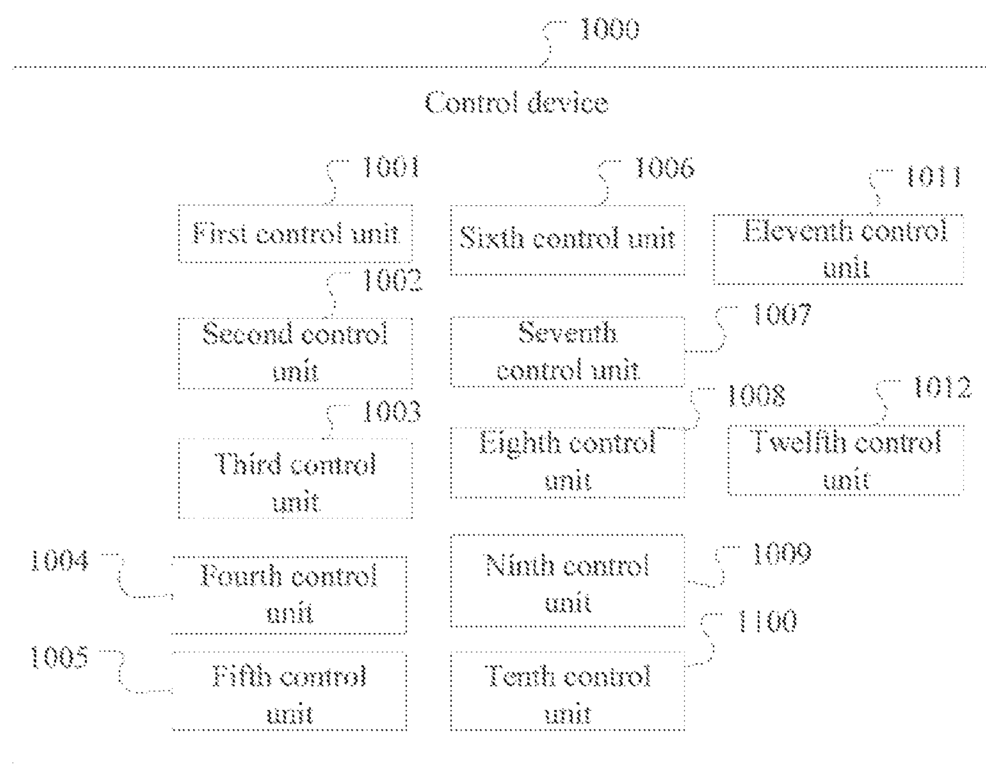
FIG. 10 illustrates an exemplary block diagram of a structure of a control device consistent with various embodiments of the present disclosure.

Specifically, in one embodiment, the control device provided in FIG. 10 may be used to control the disclosed SG driver circuit. The control device 1000 may include a first control unit 1001, a second control unit 1002, a third control unit 1003, a fourth control unit 1004, and a fifth control unit 1005.

Specifically, the first control unit 1001, the second control unit 1002, the third control unit 1003, and the fourth control unit 1004 may be configured to apply proper signals on the exemplary SG driver circuit shown in FIG. 4. The first control unit 1001, the second control unit 1002, the third control unit 1003, the fourth control unit 1004, and the fifth control unit 1005 may be configured to apply proper signals on the exemplary SG driver circuit shown in FIG. 6.

The first control unit 1001 may be configured to apply the logic high voltage level on the source electrode of the second PMOS transistor P102.

The second control unit 1002 may be configured to apply the seventh control signal S107 on the source electrode of the second NMOS transistor N102. The seventh control signal S107 may provide a logic high voltage level when the NVRAM is at idle phase and at word line preparation phase of the read operation. The seventh control signal S107 may provide a logic low voltage level when the NVRAM is at execution phase of the read operation. A read operation phase may include the word line preparation phase of the read operation and the execution phase of the read operation.

The third control unit 1003 may be configured to apply a logic low voltage level on the gate electrode of the first PMOS transistor P101.

The fourth control unit 1004 may be configured to apply a second control signal S102 on the gate electrode of the second PMOS transistor P102. The second control signal S102 may provide a logic low voltage level when the NVRAM is at idle phase, and may provide a logic high voltage level when the NVRAM is at read operation phase.

The fifth control unit 1005 may be configured to apply a first control signal S101 on the gate electrode of the fourth NMOS transistor N104.

By using the control device/circuit described above, the first NMOS transistor N101 may be turned off to block or separate the first PMOS transistor P101 from the third NMOS transistor N103 when the NVRAM is switching from idle phase to read operation phase. The competition between the first PMOS transistor P101 and the third NMOS transistor N103 may be eliminated or reduced. The read operation may be executed accurately.

Figure 5:
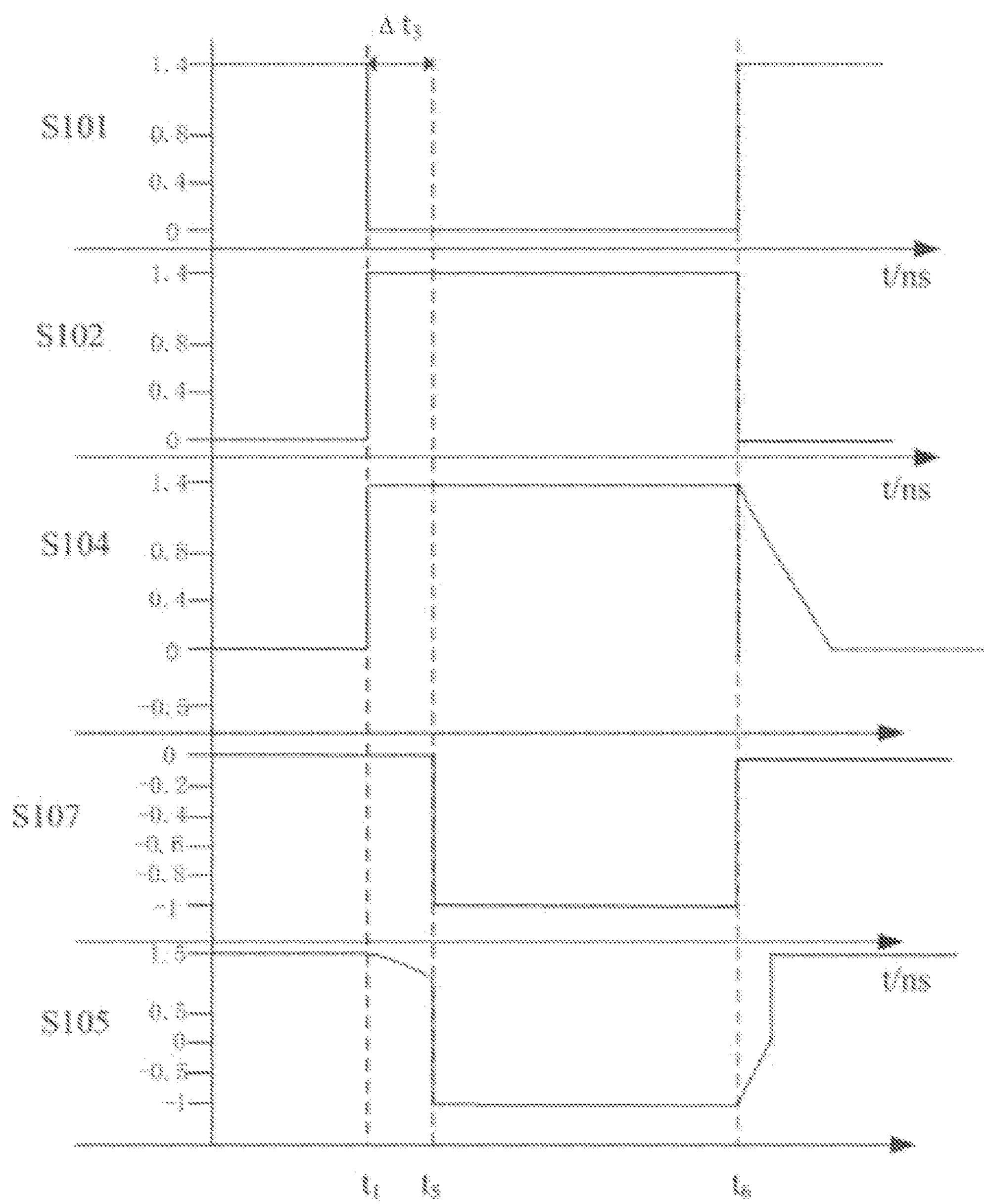
FIG. 5 illustrates a wave-function diagram of certain signals of the NVRAM in FIG. 4 when the NVRAM is operated in high speed consistent with various embodiments of the present disclosure.

Specifically, as shown in FIGS. 4 and 5, a method or process to control the SG driver circuit shown in FIG. 4, when the NVRAM is operated in high speed and is switching from a read operation phase to idle phase, can be described as follows.

The voltage of the first control signal S101 (not shown in FIG. 4) may be pulled up to a logic high voltage level. The logic high voltage level may be inverted by an inverter to obtain the second control signal S102. The second control signal S102 may provide a logic low voltage level. Because the eighth control signal S108 is a logic high voltage level, the second PMOS transistor P102 may be turned on.

Because the third control signal S103 may provide a logic low voltage level, the first PMOS transistor P101 may be turned on. The second control signal S102 may pull down the voltage of the fourth control signal S104. However, in a read operation phase, the voltage of the fourth control signal S104 may be sufficiently high. Even if the voltage of the fourth control signal S104 is pulled down by a certain amount, the fourth control signal S014 may still keep the second NMOS transistor N102 on as long as the voltage of the fourth control signal S104 is not lower than 1.0 V, which is the threshold voltage of the second NMOS transistor N102.

After the second NMOS transistor N102 is turned on, because the voltage of the seventh control signal S107 switches from −1 V to 0 V, the seventh control signal S107 may pull up the output voltage of the fifth output signal S105 through the second NMOS transistor N102. Comparatively, the pulling up of the output voltage of the fifth output signal S105, through the second PMOS transistor P102, by the logic high voltage level VDD, may be stronger than the pulling down of the output voltage of the fifth output signal S105, through the second NMOS transistor N102, by the seventh control signal S107. Thus, the output voltage of the fifth output signal S105 may increase. However, because the voltage of the fourth control signal S104 may drop or decrease sufficiently slow, the NVRAM may switch from a read operation phase back to idle phase with an undesirably slow speed.

Figure 6:
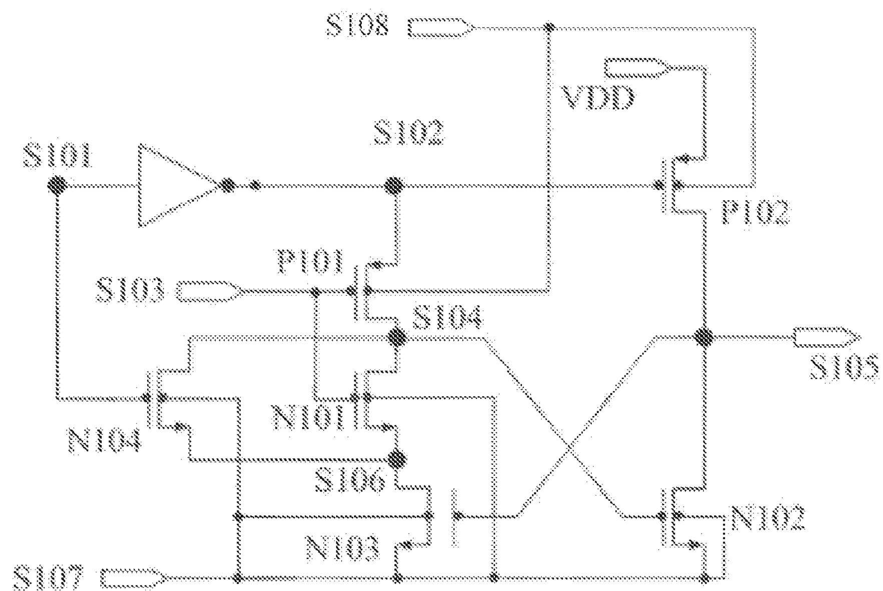
FIG. 6 illustrates a structure of another exemplary SG driver circuit incorporated in an NVRAM consistent with various embodiments of the present disclosure.

To further improve the switching speed, from the read operation phase back to the idle phase, of the NVRAM, embodiments of the present disclosure provide anther SG driver circuit. As shown in FIG. 6, the SG driver circuit may further include a fourth NMOS transistor N104.

The gate electrode of the fourth NMOS transistor N104 may be configured to receive the first control signal S101. The source electrode of the fourth NMOS transistor N104 may be connected to the source electrode of the first NMOS transistor N101. The drain electrode of the fourth NMOS transistor N104 may be connected to the drain electrode of the first PMOS transistor P101. The source electrode of the first PMOS transistor P101 may be configured to receive the second control signal S102. The second control signal S102 may be inverted from the first control signal S101, i.e., the second control signal S102 may be an inverted signal of the first control signal S101.

Specifically, the control method or control process to control the SG driver circuit shown in FIG. 6 may be described as follows.

A first control signal S101 may be applied on the gate electrode of the fourth NMOS transistor N104. The first control signal S101 may provide a logic high voltage level at idle phase and may provide a logic low voltage level at execution phase of the read operation.

A sixth control signal S106 may be applied on the source electrode of the first NMOS transistor N101, the drain electrode of the third NMOS transistor N103, and the source electrode of the fourth NMOS transistor N104. The sixth control signal S106 may provide a logic high voltage level at idle phase and may provide a logic low voltage level at execution phase of the read operation.

A fourth control signal S104 may be applied on the drain electrode of the fourth NMOS transistor N104.

As shown in FIGS. 6-9, the disclosed SG driver circuit and the working principles of the disclosed SG driver circuit, for driving an NVRAM, may be described as follows.

When operated in high speed, if an NVRAM is switching from a reading operation phase to idle phase, the first control signal S101 may provide a logic high voltage level. The logic high voltage level provided by the first control signal S101 may be inverted by an inverter, and the inverter may output the second control signal S102, which is a logic low voltage level. Because a logic high voltage level is applied on the source electrode of the second PMOS transistor. The second PMOS transistor may be turned on.

Because the third control signal S103 may provide a logic low voltage level, the first PMOS transistor P101 may be turned on and the first NMOS transistor N101 may be turned off. The second control signal S102 may pull down the voltage of the fourth control signal S104 through the first PMOS transistor P101. However, at the execution phase of the read operation, the voltage of the fourth control signal S104 may be sufficiently high that even after pulled down by the second control signal S102, the voltage of the fourth control signal S104 may still be sufficiently high to keep the second NMOS transistor N102 on.

After the second NMOS transistor N102 is turned on, the voltage of the seventh control signal S107 may switch from 0 V to −1 V. The seventh control signal S107 may pull the output voltage of the fifth output signal S105 down to 0 V through the second NMOS transistor N102. However, comparatively, as described above, the second PMOS transistor P102 may be on, so the eighth control signal S108 may pull up the output voltage of the fifth output signal S105 through the second PMOS transistor P102.

As described above, the fourth control signal S104 is pulled down to a lower voltage value. That is, even if the second NMOS transistor N102 is on, comparatively, the pulling up of the output voltage of the fifth output signal S105 through the second PMOS transistor P102, by the logic high voltage level applied on the source electrode of the second PMOS transistor P102, may be stronger. The output voltage of the fifth output signal S105 may keep increasing.

Because the first control signal S101 may provide a logic high voltage level, the fourth NMOS transistor N104 may be turned on. The voltage of the sixth control signal S106 may be pulled up to a logic high voltage level and the third NMOS transistor N103 may be turned on. The seventh control signal S107 may pull down the voltage of the fourth control signal S104 through the third NMOS transistor N103 and the fourth NMOS transistor N104. Thus, the voltage of the fourth control signal S104 may be pulled down in a sufficiently short time to turn off the second NMOS transistor N102.

Thus, only the eighth control signal S108 may pull up the output voltage of the fifth output signal S105 through the second PMOS transistor P102. The NVRAM may switch from the execution phase of the read operation to idle phase quickly or in a desirable short time.

FIG. 7 illustrates the structure of another exemplary SG driver circuit. Different from the SG driver circuit shown in FIG. 6, the SG driver circuit exemplified in FIG. 7 may further include a third PMOS transistor P103 and a fourth PMOS transistor P104.

The drain electrode of the third PMOS transistor P103 may be connected to the drain electrode of the fourth PMOS transistor P104 and the gate electrode of the fourth NMOS transistor N104 to be a first control terminal. The source electrode of the third PMOS transistor P103 may be connected to the source electrode of the fourth PMOS transistor P104.

The gate electrode of the fourth PMOS transistor P104 may be connected to the source electrode of the first PMOS transistor P101.

Embodiments of the present disclosure further provide a control method for controlling the SG driver circuit exemplified in FIG. 7. The control method or process may include the following steps.

The first control signal S101 may be applied on the first control terminal.

The logic high voltage level VDD may be applied on the source electrode of the third PMOS transistor P103 and the source electrode of the fourth PMOS transistor P104.

A ninth control signal S109 may be applied on the gate electrode of the third PMOS transistor P103. The ninth control signal S109 may provide a logic low voltage level when the NVRAM is at idle phase, and may provide a logic high voltage level when the NVRAM is at read operation phase.

The second control signal S102 may be applied on the gate electrode of the fourth PMOS transistor P104.

FIG. 8 illustrates the structure of another exemplary SG driver circuit. Different from the SG driver circuit shown in FIG. 6, the SG driver circuit exemplified in FIG. 8 may further include a fifth NMOS transistor N105, a sixth NMOS transistor N106, and a seventh NMOS transistor N107.

The drain electrode of the fifth NMOS transistor N105 may be connected to the gate electrode of the fourth NMOS transistor N104. The source electrode of the fifth NMOS transistor N105 may be connected to the drain electrode of the sixth NMOS transistor N106. The source electrode of the sixth NMOS transistor N106 may be connected to the drain electrode of the seventh NMOS transistor N107.

The source electrode of the sixth NMOS transistor N106 may be connected to the drain electrode of the seventh NMOS transistor N107.

Embodiments of the present disclosure provide a control method or control process for controlling the SG driver circuit exemplified in FIG. 8. The control method may include the following steps.

The first control signal S101 may be applied on the drain electrode of the fifth NMOS transistor N105.

A tenth control signal S110 may be applied on the gate electrode of the fifth NMOS transistor N105. The tenth control signal S110 may provide a logic low voltage level when the NVRAM is at idle phase and may provide a logic high voltage level when the NVRAM is at execution phase of the read operation.

An eleventh control signal S111 may be applied on the source electrode of the fifth NMOS transistor N105 and the drain electrode of the sixth NMOS transistor N106. The eleventh control signal S111 may provide a logic low voltage level when the NVRAM is at idle phase, and may provide a logic high voltage level when the NVRAM is at execution phase of the read operation.

A twelfth control signal S112 may be applied on the gate of the sixth NMOS transistor N106. The twelfth control signal S112 may provide a logic low voltage level when the NVRAM is at idle phase, and may provide a logic high voltage level when the NVRAM is at execution phase of the read operation.

A thirteenth control signal S113 may be applied on the source electrode of the sixth NMOS transistor N106 and the drain electrode of the seventh NMOS transistor N107. The thirteenth control signal S113 may provide a logic low voltage level when the NVRAM is at idle phase, and may provide a logic high voltage level when the NVRAM is at execution phase of the read operation.

The ninth control signal S109 may be applied on the gate electrode of the seventh NMOS transistor N107.

A logic low voltage level voltage VSS may be applied on the source electrode of the seventh NMOS transistor N107.

In FIGS. 7 and 8, the ninth control signal S109, the tenth control signal S110, the eleventh control signal S111, the twelfth control signal S112, and the thirteen control signal S113 may be input control signals. Referring to FIGS. 8 and 9, when the NVRAM is switching from idle phase to execution phase of the read operation, the ninth control signal S109, the tenth control signal S110, the eleventh control signal S111, the twelfth control signal S112, and the thirteen control signal S113 may provide logic high voltage levels. Thus, the third PMOS transistor P103 may be turned off, and the fifth NMOS transistor N105, the sixth NMOS transistor N106, and the seventh NMOS transistor N107 may be turned on so that the first control signal S101 may be controlled to provide a logic low voltage level. When the NVRAM is switching from execution phase of the read operation to idle phase, the ninth control signal S109, the tenth control signal S110, the eleventh control signal S111, the twelfth control signal S112, and the thirteen control signal S113 may provide logic low voltage levels. The third PMOS transistor P103 may be turned on, and the fifth NMOS transistor N105, the sixth NMOS transistor N106, and the seventh NMOS transistor N107 may be turned off. Thus, the logic high voltage level applied on the source electrode of the third PMOS transistor P103 may pull up the voltage of the first control signal S101 through the third PMOS transistor P103 to a logic high voltage level.

As shown in FIG. 10, in one embodiment, the control device 1000 used to control the disclosed SG driver circuit may further include a sixth control unit 1006, a seventh control unit 1007, an eighth control unit 1008, a ninth control unit 1009, a tenth control unit 1010, an eleventh control unit 1011, and a twelfth control unit 1012.

Specifically, the first control unit 1001, the second control unit 1002, the third control unit 1003, the fourth control unit 1004, the fifth control unit 1005, the sixth control unit 1006, and the seventh control unit 1007 may be configured to apply proper signals on the exemplary SG driver circuit shown in FIG. 7. The first control unit 1001, the second control unit 1002, the third control unit 1003, the fourth control unit 1004, the fifth control unit 1005, the sixth control unit 1006, the seventh control unit 1007, the eighth control unit 1008, the ninth control unit 1009, the tenth control unit 1010, the eleventh control unit 1011, and the twelfth control unit 1012 may be configured to apply proper signals on the exemplary SG driver circuit shown in FIG. 8.

The sixth control unit 1006 may be configured to apply a ninth control signal S109 on the gate electrode of the third PMOS transistor P103. The ninth control signal S109 may provide a logic low voltage level when the NVRAM is at idle phase, and provide a logic high voltage level when the NVRAM is at read operation phase.

The seventh control unit 1007 may be configured to apply a logic high voltage level on the source electrode of the third PMOS P103.

The eighth control unit 1008 may be configured to apply a tenth control signal S110 on the gate electrode of the fifth NMOS transistor N105. The tenth control signal S110 may provide a logic low voltage level when the NVRAM is at idle phase, and provide a logic high voltage level when the NVRAM is at read operation phase.

The ninth control unit 1009 may be configured to apply an eleventh control signal S111 on the source electrode of the fifth NMOS transistor N105. The eleventh control signal S111 may output a logic low voltage level when the NVRAM is at idle phase, and provide a logic high voltage level when the NVRAM is at read operation phase.

The tenth control unit 1010 may be configured to apply the twelfth control signal S112 on the gate electrode of the sixth NMOS transistor N106. The twelfth control signal S112 may provide a logic low voltage level when the NVRAM is at idle phase, and provide a logic high voltage level when the NVRAM is at read operation phase.

The eleventh control unit 1011 may be configured to apply the thirteenth control signal S113 on the source electrode of the sixth NMOS transistor N106. The thirteenth control signal S113 may provide a logic low voltage level when the NVRAM is at idle phase, and provide a logic high voltage level when the NVRAM is at read operation phase.

The twelfth control unit 1012 may be configured to apply a logic low voltage level on the source electrode of the seventh NMOS transistor N107.

The functions of control units 1001-1005 may be referred to the description of previous embodiments and are not repeated herein.

Those of ordinary skill will be appreciated that in the various embodiments of the method described above, all or part of the method may be implemented by a program instructing relevant hardware. The program may be stored in a computer readable storage medium. The storage medium may include read-only memories (ROMs), random-access memories (RAMs), disks, or CD-ROMs.

Compared to a conventional transistor, the fabrication method provided in the current disclosure has several advantages.

When the NVRAM is operated in high speed, if a read operation is to be executed, the NVRAM may need to switch from idle phase to read operation phase. By using the disclosed SG driver circuit to drive the NVRAM, the second control signal may provide a logic high voltage level and the third control signal may provide a logic low voltage level, so that the first PMOS transistor may be turned on and the first NMOS transistor may be turned off. The voltage of the fourth control signal may be pulled up by the second control signal to a logic high voltage level so that the second NMOS transistor may be turned on.

Thus, the seventh control signal may pull down the output voltage of the fifth output signal through the second NMOS transistor. The NVRAM may only be operating at the word line preparation phase of the read operation for a short time when operated in high speed. As a result, after the word line preparation phase of the read operation, the output voltage of the fifth output signal may still be sufficiently high to keep the third NMOS transistor on. However, after the word line preparation phase of the read operation, the first NMOS transistor may be turned off, and the seventh control signal may not be able to pull down the voltage of the fourth control signal through the third NMOS transistor. The competition between the first PMOS transistor and the third NMOS transistor may be eliminated or reduced. The output voltage of the fifth output signal may be pulled down to the target voltage for the read operation to be accurately executed.

Further, when the NVRAM is operated in high speed and switching from read operation phase to idle phase, the first control signal may provide a logic high voltage level so that the fourth NMOS transistor may be turned on. The second control signal, i.e., the inverted signal of the first control signal, may provide a logic low voltage level and may enable the second PMOS transistor to be turned on. The first control signal or the logic high voltage level may pull up the output voltage of the fifth output signal through the second PMOS transistor. Also, because the third control signal may provide a logic low voltage level, the first NMOS transistor may be turned off. The seventh control signal may pull down the voltage of the fourth control signal through the fourth NMOS transistor to turn off the second NMOS transistor. Thus, the seventh control signal would not be able to pull down the output voltage of the fifth output signal through the second NMOS transistor. The competition between the second PMOS transistor and the second NMOS transistor may be eliminated or reduced. The output voltage of the fifth output signal may be quickly pulled up to the target voltage. The operating speed of the NVRAM may be improved.

Further, after the word line preparation phase of the read operation, the first NMOS transistor may be turned off. The seventh control signal would not be able to pull down the voltage of the fourth control signal through the third NMOS transistor. As a result, the competition between the first PMOS transistor and the third NMOS transistor may be eliminated or reduced. The output voltage of the fifth output signal may be pulled down to the target voltage for the read operation to be accurately executed. It would not be necessary to consider the ratio of the driving ability of the first PMOS transistor to the driving ability of the third NMOS transistor. The volume of the NVRAM or chip may be reduced.

Further, in high speed, the NVRAM only operates at the word line preparation phase of the read operation for a short time. After the word line preparation phase of the read operation, the output voltage of the fifth output signal may still be sufficiently high to turn on the third NMOS transistor. However, because the first NMOS transistor may be turned off after the word line preparation phase of the read operation, the seventh control signal would not be able to pull down the voltage of the fourth control signal through the third NMOS transistor. The read operation may be executed accurately. The time, that the word line preparation phase of the read operation takes, does not need to be considered in the operation of the NVRAM. The NVRAM may be operated in higher speed.

Further, because all the control signals, e.g., the ninth control signal, the tenth control signal, the eleventh control signal, the twelfth control signal, the thirteenth control signal, and the seventh control signal, may be the signals already exist in an existing NVRAM structure. No additional new control signals need to be introduced. The design of the SG driver circuit may be easier and more convenient.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A selected gate (SG) driver circuit used in a memory circuit, comprising:

a first NMOS transistor, a second NMOS transistor, a third NMOS transistor, a first PMOS transistor, and a second PMOS transistor, wherein:

a gate electrode of the first NMOS transistor is connected to a gate electrode of the first PMOS transistor, a source electrode of the first NMOS transistor being connected to a drain electrode of the third NMOS transistor, and a drain electrode of the first NMOS transistor being connected to a drain electrode of the first PMOS transistor and a gate electrode of the second NMOS transistor;

a source electrode of the second NMOS transistor is connected to a source electrode of the third NMOS transistor, and a drain electrode of the second NMOS transistor being connected to a drain electrode of the second PMOS transistor and a gate electrode of the third NMOS transistor;

a source electrode of the first PMOS transistor is connected to a gate electrode of the second PMOS transistor; and a logic high voltage level is connected to a source electrode of the second PMOS transistor.

2. The SG driver circuit according to claim 1, further including a fourth NMOS transistor, wherein:

a gate electrode of the fourth NMOS transistor is configured to receive a first control signal, a source electrode of the fourth NMOS transistor being connected to the source electrode of the first NMOS transistor, and a drain electrode of the fourth NMOS transistor being connected to the drain electrode of the first PMOS transistor; and a source electrode of the first PMOS transistor is configured to receive a second control signal, the second control signal being an inverted signal of the first control signal.

3. The SG driver circuit according to claim 2, further including a third PMOS transistor and a fourth PMOS transistor, wherein:

a drain electrode of the third PMOS transistor is connected to a drain electrode of the fourth PMOS transistor and the gate electrode of the fourth NMOS transistor to be a first control terminal, a source electrode of the third PMOS transistor being connected to a source electrode of the fourth PMOS transistor; and a gate electrode of the fourth PMOS transistor is connected to the source electrode of the first PMOS transistor.

4. A control device controlling the SG driver circuit according to claim 3, further including a sixth control unit and a seventh control unit, wherein:

the first control unit is configured to apply the logic high voltage level on the source electrode of the second PMOS transistor;

the second control unit is configured to apply a seventh control signal on the source electrode of the second NMOS transistor, the seventh control signal providing a logic high voltage level when the memory circuit is at idle phase and at word line preparation phase of a read operation, and the seventh control signal providing a logic low voltage level when the memory circuit is at execution phase of a read operation, wherein a read operation phase includes the word line preparation phase of the read operation and the execution phase of the read operation;

the third control unit is configured to apply a logic low voltage level on the gate electrode of the first PMOS transistor;

the fourth control unit is configured to apply a second control signal on the gate electrode of the second PMOS transistor; the second control signal providing a logic low voltage level when the memory circuit is at idle phase, and providing a logic high voltage level when the memory circuit is at read operation phase;

the fifth control unit is configured to apply a first control signal on the gate electrode of the fourth NMOS transistor;

the sixth control unit is configured to apply a ninth control signal on the gate electrode of the third PMOS transistor, the ninth control signal providing a logic low voltage level when the memory circuit is at idle phase, and providing a logic high voltage level when the memory circuit is at read operation phase; and the seventh control unit is configured to apply a logic high voltage level on the source electrode of the third PMOS.

5. A control method for controlling the SG driver circuit according to claim 3, comprising:

applying a logic high voltage level on the source electrode of the second PMOS transistor;

applying a logic low voltage level on the gate electrode of the first PMOS transistor;

applying a seventh control signal on the source electrode of the second NMOS transistor and the source electrode of the third NMOS transistor, the seventh control signal providing a logic high voltage level at idle phase and a logic low voltage level at execution phase of a read operation;

applying a third control signal on the gate electrode of the first PMOS transistor and the gate electrode of the first NMOS transistor; the third control signal providing a logic low voltage level;

applying a fourth control signal on the drain electrode of the first PMOS transistor, the drain electrode of the first NMOS transistor, and the gate electrode of the second NMOS transistor, the fourth control signal providing a logic low voltage level at idle phase and a logic high voltage level at execution phase of the read operation;

applying the first control signal on the gate electrode of the fourth NMOS transistor;

applying a ninth control signal on the gate electrode of the third PMOS transistor, the ninth control signal providing a logic low voltage level when the memory circuit is at idle phase, and providing a logic high voltage level when the memory circuit is at read operation phase; and applying a logic high voltage level on the source electrode of the third PMOS.

6. The SG driver circuit according to claim 3, further including a fifth NMOS transistor, a sixth NMOS transistor, and a seventh NMOS transistor, wherein:

a drain electrode of the fifth NMOS transistor is connected to the gate electrode of the fourth NMOS transistor, a source electrode of the fifth NMOS transistor being connected to a drain electrode of the sixth NMOS transistor; and a source electrode of the sixth NMOS transistor is connected to a drain electrode of the seventh NMOS transistor, a source electrode of the sixth NMOS transistor being connected to a drain electrode of the seventh NMOS transistor.

7. The SG driver circuit according to claim 2, further including a fifth NMOS transistor, a sixth NMOS transistor, and a seventh NMOS transistor, wherein:

a drain electrode of the fifth NMOS transistor is connected to the gate electrode of the fourth NMOS transistor, a source electrode of the fifth NMOS transistor being connected to a drain electrode of the sixth NMOS transistor; and a source electrode of the sixth NMOS transistor is connected to a drain electrode of the seventh NMOS transistor, a source electrode of the sixth NMOS transistor being connected to a drain electrode of the seventh NMOS transistor.

8. The SG driver circuit according to claim 7, further including an inverter for inverting the first control signal to the second control signal.

9. A control device controlling the SG driver circuit according to claim 7, further including an eighth control unit, a ninth control unit, a tenth control unit, an eleventh control unit, and a twelfth control unit, wherein:

the first control unit is configured to apply the logic high voltage level on the source electrode of the second PMOS transistor;

the second control unit is configured to apply a seventh control signal on the source electrode of the second NMOS transistor, the seventh control signal providing a logic high voltage level when the memory circuit is at idle phase and at word line preparation phase of a read operation, and the seventh control signal providing a logic low voltage level when the memory circuit is at execution phase of a read operation, wherein a read operation phase includes the word line preparation phase of the read operation and the execution phase of the read operation;

the third control unit is configured to apply a logic low voltage level on the gate electrode of the first PMOS transistor;

the fourth control unit is configured to apply a second control signal on the gate electrode of the second PMOS transistor; the second control signal providing a logic low voltage level when the memory circuit is at idle phase, and providing a logic high voltage level when the memory circuit is at read operation phase;

the fifth control unit is configured to apply a first control signal on the gate electrode of the fourth NMOS transistor;

the sixth control unit is configured to apply a ninth control signal on the gate electrode of the third PMOS transistor, the ninth control signal providing a logic low voltage level when the memory circuit is at idle phase, and providing a logic high voltage level when the memory circuit is at read operation phase;

the seventh control unit is configured to apply a logic high voltage level on the source electrode of the third PMOS;

the eighth control unit is configured to apply a tenth control signal on the gate electrode of the fifth NMOS transistor, the tenth control signal providing a logic low voltage level when the memory circuit is at idle phase, and providing a logic high voltage level when the memory circuit is at read operation phase;

the ninth control unit is configured to apply an eleventh control signal on the source electrode of the fifth NMOS transistor, the eleventh control signal providing a logic low voltage level when the memory circuit is at idle phase, and providing a logic high voltage level when the memory circuit is at read operation phase;

the tenth control unit is configured to apply a twelfth control signal on the gate electrode of the sixth NMOS transistor, the twelfth control signal providing a logic low voltage level when the memory circuit is at idle phase, and providing a logic high voltage level when the memory circuit is at read operation phase;

the eleventh control unit is configured to apply a thirteenth control signal on the source electrode of the sixth NMOS transistor, the thirteenth control signal providing a logic low voltage level when the memory circuit is at idle phase, and providing a logic high voltage level when the memory circuit is at read operation phase; and the twelfth control unit is configured to apply a logic low voltage level on the source electrode of the seventh NMOS transistor.

10. A control method for controlling the SG driver circuit according to claim 7, comprising:

applying a logic high voltage level on the source electrode of the second PMOS transistor;

applying a logic low voltage level on the gate electrode of the first PMOS transistor;

applying a seventh control signal on the source electrode of the second NMOS transistor and the source electrode of the third NMOS transistor, the seventh control signal providing a logic high voltage level at idle phase and a logic low voltage level at execution phase of a read operation;

applying a third control signal on the gate electrode of the first PMOS transistor and the gate electrode of the first NMOS transistor; the third control signal providing a logic low voltage level;

applying a fourth control signal on the drain electrode of the first PMOS transistor, the drain electrode of the first NMOS transistor, and the gate electrode of the second NMOS transistor, the fourth control signal providing a logic low voltage level at idle phase and a logic high voltage level at execution phase of the read operation;

applying the first control signal on the gate electrode of the fourth NMOS transistor;

applying a ninth control signal on the gate electrode of the third PMOS transistor, the ninth control signal providing a logic low voltage level when the memory circuit is at idle phase, and providing a logic high voltage level when the memory circuit is at read operation phase;

applying a logic high voltage level on the source electrode of the third PMOS;

applying a tenth control signal on the gate electrode of the fifth NMOS transistor, the tenth control signal providing a logic low voltage level when the memory circuit is at idle phase, and providing a logic high voltage level when the memory circuit is at read operation phase;

applying an eleventh control signal on the source electrode of the fifth NMOS transistor, the eleventh control signal providing a logic low voltage level when the memory circuit is at idle phase, and providing a logic high voltage level when the memory circuit is at read operation phase;

applying a twelfth control signal on the gate electrode of the sixth NMOS transistor, the twelfth control signal providing a logic low voltage level when the memory circuit is at idle phase, and providing a logic high voltage level when the memory circuit is at read operation phase;

applying a thirteenth control signal on the source electrode of the sixth NMOS transistor, the thirteenth control signal providing a logic low voltage level when the memory circuit is at idle phase, and providing a logic high voltage level when the memory circuit is at read operation phase; and applying a logic low voltage level on the source electrode of the seventh NMOS transistor.

11. A control device controlling the SG driver circuit according to claim 2, further including a fifth control unit, wherein:

the first control unit is configured to apply the logic high voltage level on the source electrode of the second PMOS transistor;

the second control unit is configured to apply a seventh control signal on the source electrode of the second NMOS transistor, the seventh control signal providing a logic high voltage level when the memory circuit is at idle phase and at word line preparation phase of a read operation, and the seventh control signal providing a logic low voltage level when the memory circuit is at execution phase of a read operation, wherein a read operation phase includes the word line preparation phase of the read operation and the execution phase of the read operation;

the third control unit is configured to apply a logic low voltage level on the gate electrode of the first PMOS transistor;

the fourth control unit is configured to apply a second control signal on the gate electrode of the second PMOS transistor; the second control signal providing a logic low voltage level when the memory circuit is at idle phase, and providing a logic high voltage level when the memory circuit is at read operation phase; and the fifth control unit is configured to apply a first control signal on the gate electrode of the fourth NMOS transistor.

12. A control method for controlling the SG driver circuit according to claim 2, comprising:

applying a logic high voltage level on the source electrode of the second PMOS transistor;

applying a logic low voltage level on the gate electrode of the first PMOS transistor;

applying a seventh control signal on the source electrode of the second NMOS transistor and the source electrode of the third NMOS transistor, the seventh control signal providing a logic high voltage level at idle phase and a logic low voltage level at execution phase of a read operation;

applying a third control signal on the gate electrode of the first PMOS transistor and the gate electrode of the first NMOS transistor; the third control signal providing a logic low voltage level;

applying a fourth control signal on the drain electrode of the first PMOS transistor, the drain electrode of the first NMOS transistor, and the gate electrode of the second NMOS transistor, the fourth control signal providing a logic low voltage level at idle phase and a logic high voltage level at execution phase of the read operation; and applying the first control signal on the gate electrode of the fourth NMOS transistor.

13. A control device for controlling the SG driver circuit according to claim 1, comprising:

a first control unit, a second control unit, a third control unit, and a fourth control unit, wherein:

the first control unit is configured to apply the logic high voltage level on the source electrode of the second PMOS transistor;

the second control unit is configured to apply a seventh control signal on the source electrode of the second NMOS transistor, the seventh control signal providing a logic high voltage level when the memory circuit is at idle phase and at word line preparation phase of a read operation, and the seventh control signal providing a logic low voltage level when the memory circuit is at execution phase of a read operation, wherein a read operation phase includes the word line preparation phase of the read operation and the execution phase of the read operation;

the third control unit is configured to apply a logic low voltage level on the gate electrode of the first PMOS transistor; and the fourth control unit is configured to apply a second control signal on the gate electrode of the second PMOS transistor, the second control signal providing a logic low voltage level when the memory circuit is at idle phase, and providing a logic high voltage level when the memory circuit is at read operation phase.

14. A control method for controlling the SG driver circuit according to claim 1, comprising:

applying a logic high voltage level on the source electrode of the second PMOS transistor;

applying a logic low voltage level on the gate electrode of the first PMOS transistor;

applying a seventh control signal on the source electrode of the second NMOS transistor and the source electrode of the third NMOS transistor, the seventh control signal providing a logic high voltage level at idle phase and a logic low voltage level at execution phase of a read operation;

applying a third control signal on the gate electrode of the first PMOS transistor and the gate electrode of the first NMOS transistor; the third control signal providing a logic low voltage level; and applying a fourth control signal on the drain electrode of the first PMOS transistor, the drain electrode of the first NMOS transistor, and the gate electrode of the second NMOS transistor, the fourth control signal providing a logic low voltage level at idle phase and a logic high voltage level at execution phase of the read operation.

* * * * *